United States Patent
Sakaguchi

(10) Patent No.: US 10,817,773 B2
(45) Date of Patent: Oct. 27, 2020

(54) ARITHMETIC PROCESSING DEVICE AND ARITHMETIC PROCESSING METHOD

(71) Applicant: Sony Corporation, Tokyo (JP)

(72) Inventor: Hiroaki Sakaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 42 days.

(21) Appl. No.: 16/088,979

(22) PCT Filed: May 10, 2017

(86) PCT No.: PCT/JP2017/017616
§ 371 (c)(1),
(2) Date: Sep. 27, 2018

(87) PCT Pub. No.: WO2017/203975
PCT Pub. Date: Nov. 30, 2017

(65) Prior Publication Data
US 2019/0130245 A1  May 2, 2019

(30) Foreign Application Priority Data

May 24, 2016  (JP) .................................. 2016-103002

(51) Int. Cl.
*H03M 13/00* (2006.01)
*G06N 3/02* (2006.01)
(Continued)

(52) U.S. Cl.
CPC .............. *G06N 3/02* (2013.01); *G06F 11/18* (2013.01); *G06N 3/0454* (2013.01); *G06N 3/063* (2013.01);
(Continued)

(58) Field of Classification Search
CPC ........ G06N 3/02; G06N 3/0454; G06N 3/063; G06N 3/08; G06F 11/18; G06F 7/483;
(Continued)

(56) References Cited

U.S. PATENT DOCUMENTS 6,353,816 B1 *  3/2002  Tsukimoto ............... G06N 3/08
706/17
2019/0095175 A1 *  3/2019  Yamanaka .......... G06F 7/49947
(Continued)

FOREIGN PATENT DOCUMENTS

JP    08-249302 A    9/1996
JP    2015-210709 A    11/2015

OTHER PUBLICATIONS

T.Tsuzuki et al., "A Learning Algorithm for Fault-Tolerant Neural Networks using Maximum-Error Prediction," IEICE Technical Report, vol. 98, No. 235, Aug. 6, 1998, Japan.

*Primary Examiner* — Christine T. Tu
(74) *Attorney, Agent, or Firm* — Michael Best & Friedrich LLP

(57) ABSTRACT

The present technology relates to an arithmetic processing device and an arithmetic processing method that enable the reduction of a circuit area while lowering power consumption, in performing more reliable arithmetic operations of a neural network.

In arithmetic operations of the neural network, the arithmetic processing device makes a specific part of bits of a weighting coefficient and input data used for the arithmetic operations redundant such that redundancy of the specific part of bits becomes larger than redundancy of remaining bits except the specific part of bits, thereby being able to reduce the circuit area while lowering the power consumption in performing reliable arithmetic operations of the neural network. The present technology can be applied to, for example, an arithmetic processing device configured to perform arithmetic operations of a neural network.

20 Claims, 12 Drawing Sheets

(51) Int. Cl.
*G06F 11/18* (2006.01)
*G06N 3/063* (2006.01)
*H03M 13/05* (2006.01)
*G06N 3/04* (2006.01)
*G06N 3/08* (2006.01)
*H03M 13/29* (2006.01)
*G06F 7/483* (2006.01)
*G06F 7/544* (2006.01)

(52) U.S. Cl.
CPC .............. *G06N 3/08* (2013.01); *H03M 13/05* (2013.01); *H03M 13/2906* (2013.01); *G06F 7/483* (2013.01); *G06F 7/5443* (2013.01)

(58) Field of Classification Search
CPC .. G06F 7/5443; H03M 13/05; H03M 13/2906
USPC ............... 714/755, 797, 752, 799, 763, 758; 326/10, 11, 35; 345/643; 348/207
See application file for complete search history.

(56) References Cited

U.S. PATENT DOCUMENTS

2019/0138567 A1\* 5/2019 Martin .................... G06N 3/063
2019/0294413 A1\* 9/2019 Vantrease ............. G06F 7/5443

\* cited by examiner

ARITHMETIC PROCESSING DEVICE AND ARITHMETIC PROCESSING METHOD

TECHNICAL FIELD

The present technology relates to an arithmetic processing device and an arithmetic processing method, and more particularly to an arithmetic processing device and an arithmetic processing method enabled to reduce a circuit area while lowering power consumption, in performing more reliable arithmetic operations of a neural network.

BACKGROUND ART

In recent years, researches and developments on neural networks have been actively conducted. As a technology relating to the neural network, for example, Patent Document 1 is known.

CITATION LIST

Patent Document

Patent Document 1: Japanese Patent Application Laid-Open No. 2015-210709

SUMMARY OF THE INVENTION

Problems to be Solved by the Invention

Incidentally, in an arithmetic processing device configured to perform arithmetic operations of a neural network, it is required to enhance the reliability of such arithmetic operations but, since many arithmetic units are used, power consumption and a circuit area grow large in a case where simple multiplexing is implemented. For this reason, it is desired to achieve the reduction of the circuit area while lowering the power consumption in performing more reliable arithmetic operations of the neural network.

The present technology has been made in view of such a situation and it is intended to reduce the circuit area while lowering the power consumption in performing more reliable arithmetic operations of a neural network.

Solutions to Problems

An arithmetic processing device according to an aspect of the present technology includes an arithmetic processing unit that performs an arithmetic operation of a neural network, in which, in the arithmetic operation of the neural network, a specific part of bits of a weighting coefficient and input data used for the arithmetic operation is made redundant such that redundancy of the specific part of bits becomes larger than redundancy of remaining bits except the specific part of bits.

The arithmetic processing device may be an independent device or may be a block configured to perform an arithmetic process of the arithmetic processing device. An arithmetic processing method according to one aspect, of the present technology is an arithmetic processing method corresponding to the above-described arithmetic processing device according to one aspect of the present technology.

In the arithmetic processing device and the arithmetic processing method according to one aspect of the present technology, the arithmetic operation of the neural network is performed. Additionally, in the arithmetic operation of the neural network, a specific part of bits of a weighting coefficient and input data used for the arithmetic operation is made redundant such that redundancy of the specific part of bits becomes larger than redundancy of remaining bits except the specific part of bits.

Effects of the Invention

According to one aspect of the present technology, it is possible to reduce the circuit area while lowering the power consumption in performing more reliable arithmetic operations of the neural network.

Note that the effects described herein are not necessarily limited and any effects described in the present disclosure may be applied.

MODE FOR CARRYING OUT THE INVENTION

Hereinafter, embodiments of the present technology will be described with reference to the drawings. Note that the description will be given in the following order.

1. Outline of Present Technology
2. Arithmetic Operation Example of Neural Network
3. System Configuration
4. Variations
5. Configuration of Computer <1. Outline of Present Technology>

Triple modular redundancy (TMR) is often used as a technology for masking a failure occurring in a single circuit due to radiation or the like. The triple modular redundancy is a redundant configuration technique in which modules (units) are triplexed for the purpose of achieving further reliability of a system.

In this triple modular redundancy, three units with the same function are equipped and processing results thereof are passed through a majority voting element (VOTER), such that a processing result in which two or more of the processing results match is selected. With this configuration, a failure occurring in a single circuit is masked and there appears to be no failure from the outside.

Figure 1:
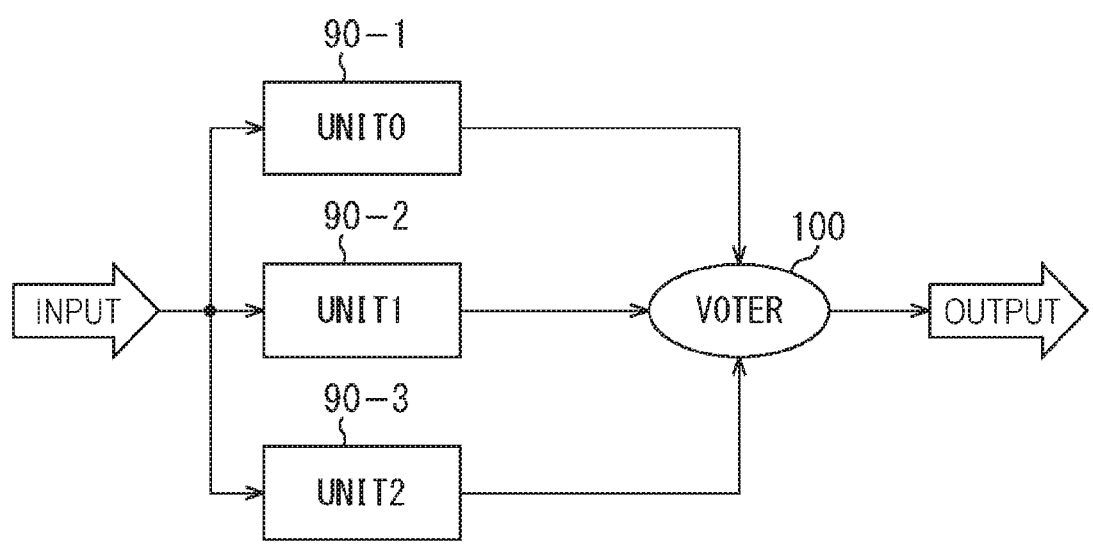
FIG. 1 is a diagram illustrating a configuration example of a triple modular redundancy.

FIG. 1 illustrates a configuration example of the triple modular redundancy. In FIG. 1, a unit (UNIT0) 90-1, a unit (UNIT1) 90-2, and a unit (UNIT2) 90-3 are provided as three units having the same function. Each unit performs a process on the same input and outputs a processing result thereof to the majority voter (VOTER) 100.

The majority voter 100 selects a processing result in which two or more of the processing results match by performing a majority vote operation on the three processing results input from the units 90-1 to 90-3 and outputs the selected processing result as an output result. This makes it possible to mask a failure occurring in a single circuit.

Note that, although the triple modular redundancy has been described as an example here, in general, 2m+1 multiplexed modular redundancy can mask m failures. Here, m is an integer equal to or greater than one. In addition, since m+1 or more failures cannot be masked but a failure can be found, it is possible not to use the output result in a case where a failure is found.

Incidentally, also in an arithmetic processing device configured to perform arithmetic operations of a neural network, it is required to enhance the reliability of the arithmetic operations. However, also in the arithmetic operations of the neural network, if the triple modular redundancy is applied to all the bits, the circuit area and power consumption thereof similarly grow large. For example, when all the bits are multiplexed, the circuit area and power consumption increase in proportion to the multiplicity thereof and are assumed to become three times or more larger.

In addition, in the arithmetic processing device configured to perform arithmetic operations of the neural network, since a lot of arithmetic units such as adders and multipliers are used, simple multiplexing cannot be ignored as cost. For this reason, it is desired to achieve the reduction of the circuit area while lowering the power consumption in performing more reliable arithmetic operations of the neural network.

Therefore, in the present technology, a specific part of bits among all the bits of data is made redundant in arithmetic operations of the neural network such that redundancy of the specific part of bits becomes larger than redundancy of remaining bits except the specific part of bits, whereby the circuit area can be reduced while the power consumption is lowered in performing more reliable arithmetic operations of the neural network.

(Configuration Example of Majority Voter)

Figure 2:
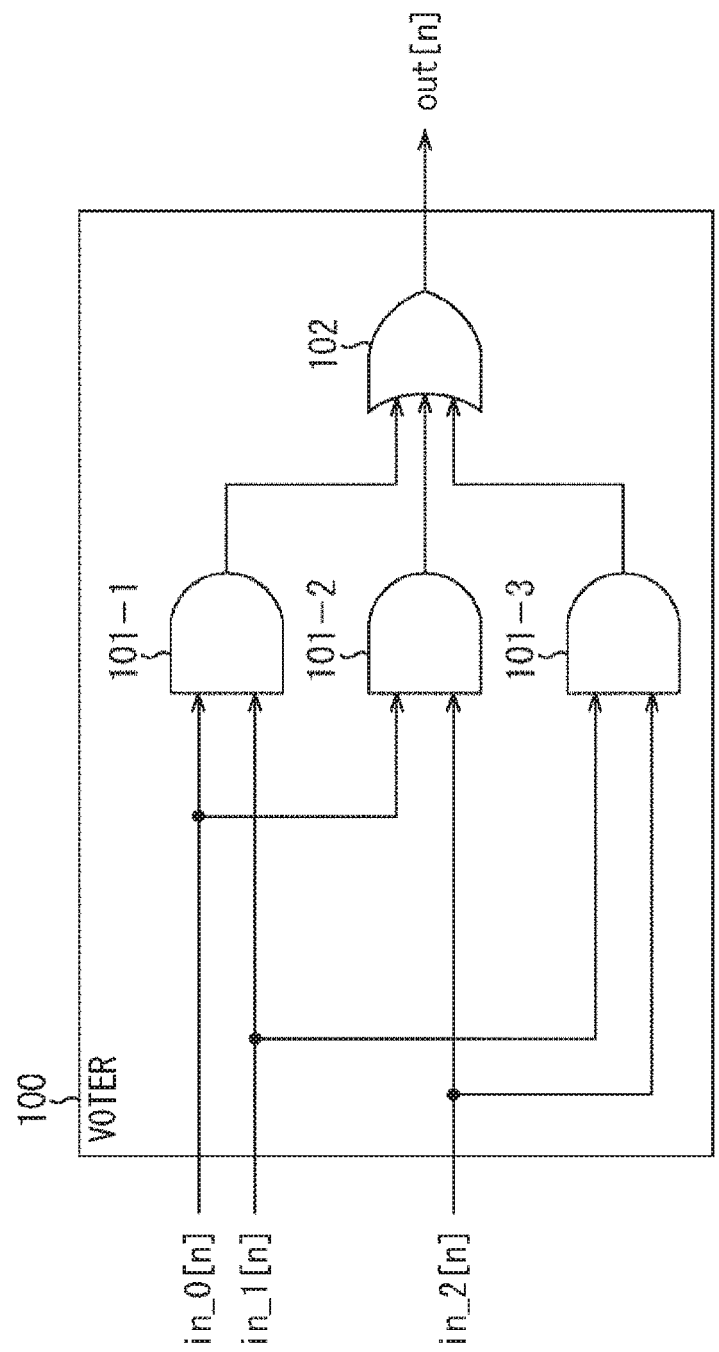
FIG. 2 is a diagram illustrating a configuration example of a logic circuit of a majority voter.

FIG. 2 is a diagram illustrating a configuration example of a logic circuit of a majority voter used in the present technology.

In FIG. 2, a majority voter 100 is constituted by an AND gate 101-1, an AND gate 101-2, an AND gate 101-3, and an OR gate 102. In the majority voter 100, input data in_0[n], input data in_1[n], and input data in_2 [n] are separately input from three units having the same function provided in the preceding stage of the gates. Note that n is an integer equal to or greater than one and, in the majority voter 100, pieces of data having the same number n are processed at the same time.

The input data in_0[n] and the input data in_1 [n] are input to the AND gate 101-1. The AND gate 101-1 performs an arithmetic operation for the logical product of the two pieces of input data and outputs the resultant data (for example, data indicating the minimum value of the two inputs) to the OR gate 102.

Similarly, the AND gate 101-2 performs an arithmetic operation for the logical product of the input data in_0[n] and the input data in_2[n] and outputs the resultant data to the OR gate 102. In addition, the AND gate 101-3 performs an arithmetic operation for the logical product of the input data in_1[n] and the input data in_2[n] and outputs the resultant data to the OR gate 102.

Data from the AND gates 101-1 to 101-3 is input to the OR gate 102. The OR gate 102 performs an arithmetic operation for the logical sum of the pieces of data that have been input and outputs the resultant output data out [n] (for example, data indicating the maximum value of the three inputs) to the subsequent stage.

As described above, in the majority voter 100, logical operations are performed by the AND gates 101-1 to 101-3 and the OR gate 102 and input data in which two or more pieces of input data out of the three pieces of input data (in_0[n], in_1[n], and in_2[n]) match (data indicating a majority value) is selected to be output as output data (out[n]). With this process, a failure occurring in a single circuit can be masked.

Figure 3:
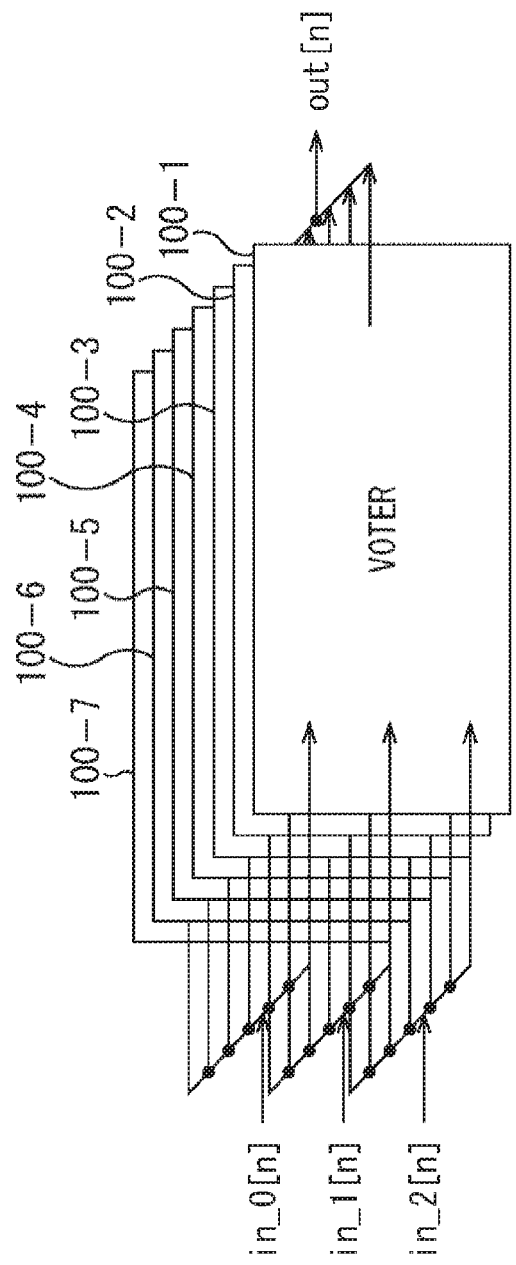
FIG. 3 is a diagram illustrating a configuration example in a case where a plurality of majority voters is provided.

In addition, as illustrated in FIG. 3, a plurality of majority voters 100 may be provided such that the majority voters 100 are multiplexed. That is, in a case where a single majority voter 100 is provided, the majority voter 100 may become a single point of fault. Therefore, by providing a plurality of majority voters 100, it is possible to more surely mask a failure. FIG. 3 exemplifies a case where majority voters 100-1 to 100-7 are provided such that the majority voters 100 are seven multiplexed.

<2. Arithmetic Operation Example of Neural Network>

Next, an example of an arithmetic operation method for a neural network to which the present technology is applied will be described with reference to FIGS. 4 to 7. Note that, here, for the sake of comparison, a case where specific bits (high-order bits) are not made redundant will be described with reference to FIG. 4 and thereafter a case where specific bits (high-order bits) are made redundant will be described with reference to FIGS. 5 to 7.

(Example of Case where Redundancy of High-Order Bits is Not Implemented)

Figure 4:
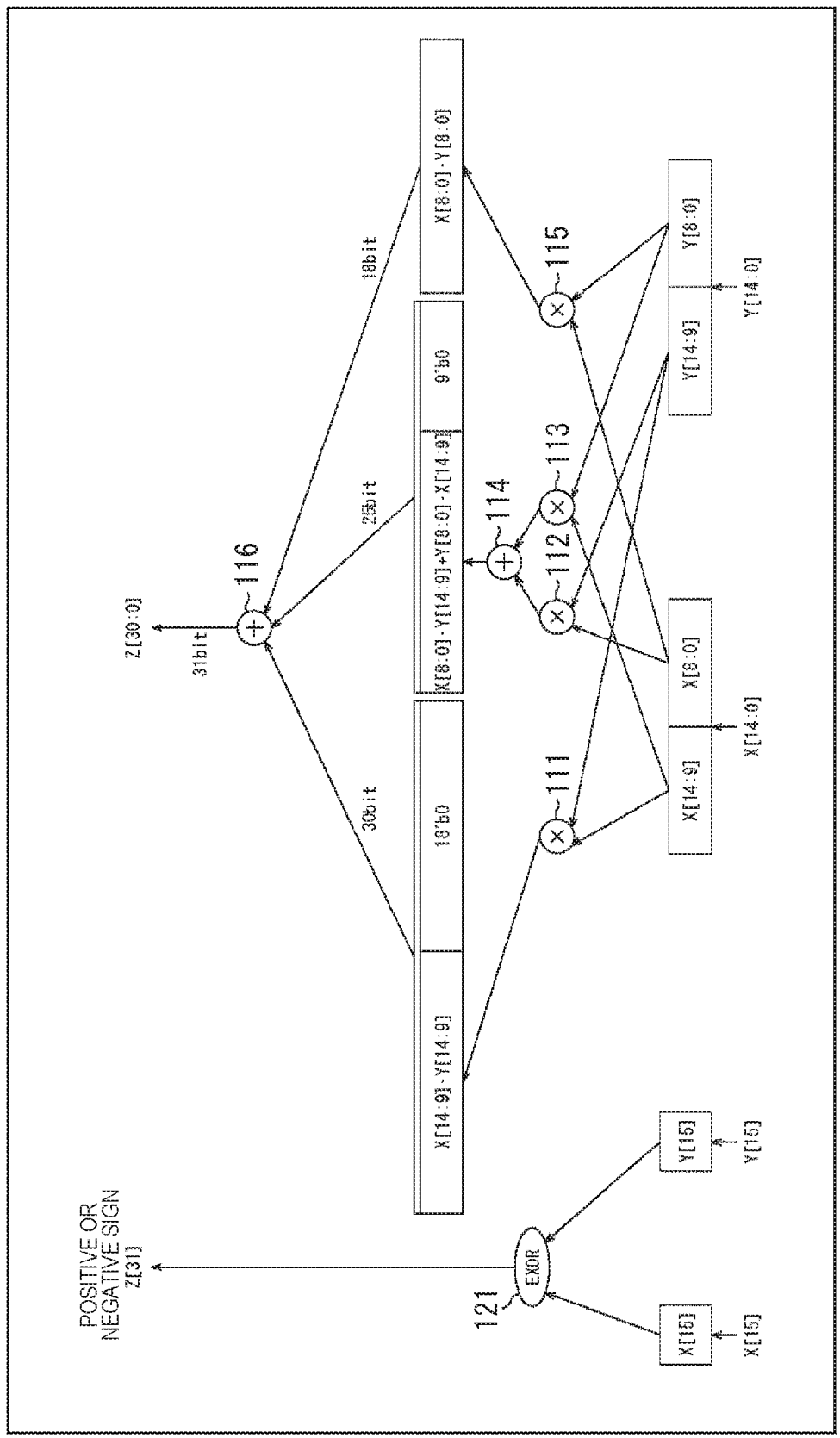
FIG. 4 is a diagram illustrating an example of arithmetic operations in a case where redundancy of high-order bits is not implemented in multiplication data of one's complement.

FIG. 4 is a diagram illustrating an example of arithmetic operations in a case where redundancy of high-order bits is not implemented in multiplication data of one's complement.

In FIG. 4, X data and Y data are used in arithmetic operations of the neural network and, among these pieces of data, for example, X can be assigned as input data and Y can be assigned as a weighting coefficient. Note that a case where the data form of the input data (X) and the weighting coefficient (Y) takes the form of fixed-point will be described here as an example. This data form is similarly applied to FIGS. 5 to 7 to be described later.

Here, X[14:0], which is 15-bit data, can be represented by X[14:9] of high-order six bits and X[8:0] of low-order nine bits. In addition, Y[14:0], which is 15-bit data, can be represented by Y[14:9] of high-order six bits and Y[8:0] of low-order nine bits. Furthermore, X[15] and Y[15], both of which are 1-bit data, each represent a most significant one bit indicating a positive or negative sign.

By multiplying the high-order bits of X[14:0] by the high-order bits of Y[14:0] in a multiplier 111, 12-bit X[14:9]·Y[14:9] is obtained. Then, by combining 18 bits all with 0 (18' b0) to the low-order bits of the arithmetic operation result obtained by the multiplier 111, 30-bit data (a combination of x [14:9]·Y[14:9] and 18' b0) is obtained.

By multiplying the low-order bits of X[14:0] by the high-order bits of Y[14:0] in a multiplier 112, X[8:0]·Y[14:9] is obtained. In addition, by multiplying the low-order bits of Y[14:0] by the high-order bits of X[14:0] in a multiplier 113, Y[8:0]·X[14:9] is obtained.

Then, by adding the arithmetic operation result obtained by the multiplier 112 and the arithmetic operation result obtained by the multiplier 113 in an adder 114, X[8:0]·Y[14:9]+Y[8:0]·X[14:9] is obtained. In addition, by combining nine bits all with 0 (9' b0) to the low-order bits of the 16-bit data obtained by the above arithmetic operation, 25-bit data (a combination of X[8:0]·Y[14:9]+Y[8:0]·X[14:9] and 9' b0) is obtained.

By multiplying the low-order bits of X[14:0] by the low-order bits of Y[14:0] in a multiplier 115, X[8:0]·Y[8:0] is obtained as 18-bit data.

In an adder 116, the 30-bit data obtained by the arithmetic operation of the multiplier 111, the 25-bit data obtained by the arithmetic operations of the multiplier 112 to the adder 114, and the 18-bit data obtained by the arithmetic operation of the multiplier 115 are added. As a result, Z[30:0] is obtained as 31-bit data.

In addition, in FIG. 4, an arithmetic operation for the exclusive OR (EXOR) between X[15] and Y[15], both of which are the most significant bits, is performed in a logical operator 121, whereby Z[31] indicating the positive or negative sign is obtained as 1-bit data.

Here, if the relationship of the above-described arithmetic operation is represented by a mathematical formula, the relationship can be represented by following formulas (1) and (2). In these formulas, formula (1) represents the product-sum operation performed by the multiplier 111 to the adder 116 in FIG. 4. Meanwhile, formula (2) represents the logical operation performed by the logical operator 121 in FIG. 4.

$$Z[30:0] = X[14:0] \cdot Y[14:0] = \quad (1)$$
$$(X[14:9] \cdot 2^\wedge 9 + X[8:0]) \, (Y[14:9] \cdot 2^\wedge 9 + Y[8:0]) =$$
$$X[14:9] \cdot Y[14:9] \cdot 2^\wedge 18 +$$
$$(X[8:0] \cdot Y[14:9] + Y[8:0] \cdot X[14:9]) \cdot 2^\wedge 9 + X[8:0] \cdot Y[8:0]$$

$$X[31] \, exor \, Y[31] \quad (2)$$

Note that, in formula (1), "·" means multiplication and "∧" represents exponentiation. In addition, in formula (2), "exor" means the exclusive OR (EXOR).

As described above, in the arithmetic operations of the neural network, for example, the product-sum operation is performed on the input data (X) and the weighting coefficient (Y) and the resultant data (Z) is output.

(Example of Case where Redundancy of High-Order Bits is Implemented)

Figure 5:
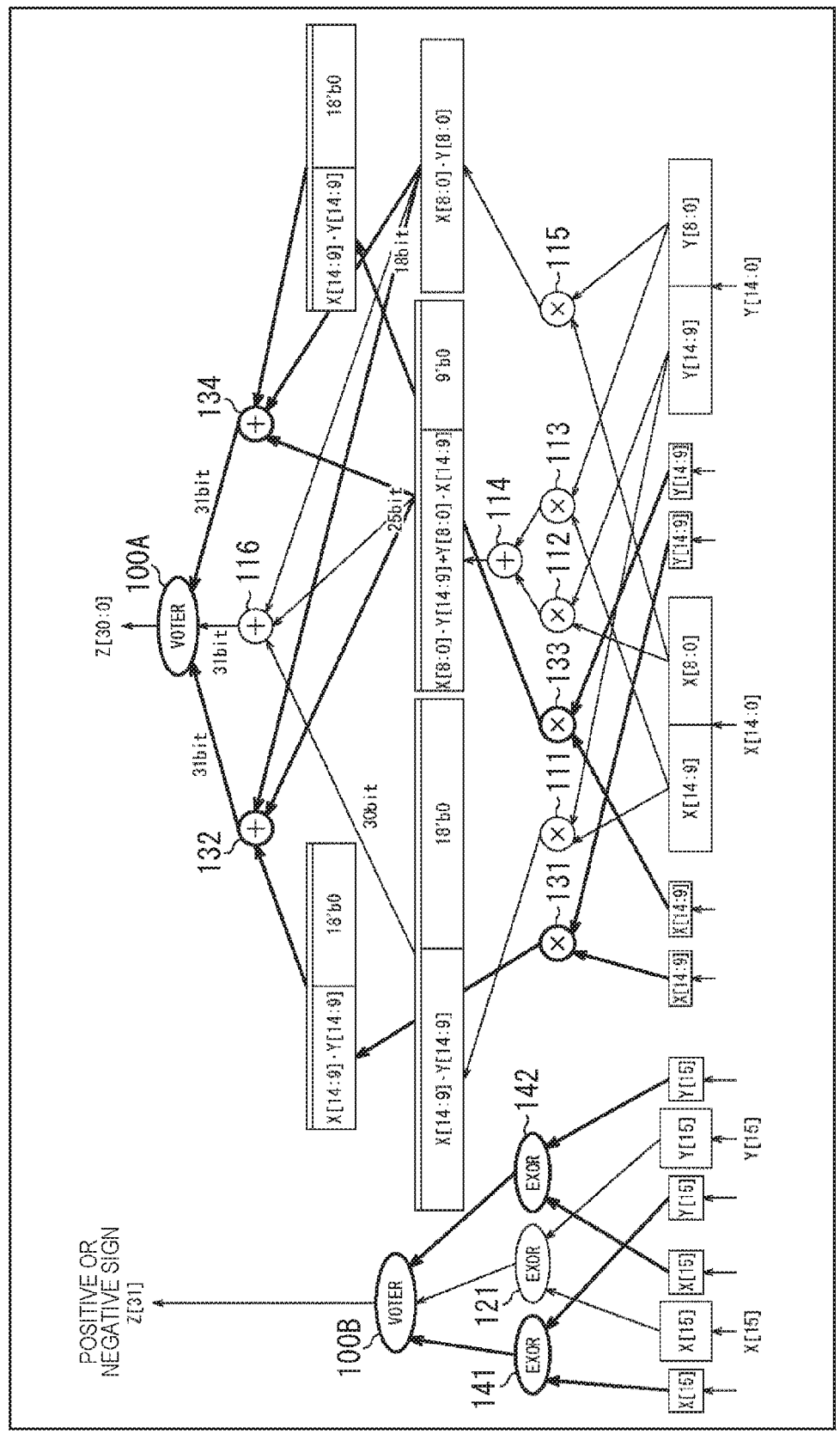
FIG. 5 is a diagram illustrating an example of arithmetic operations in a case where redundancy of high-order bits is implemented in multiplication data of one's complement.

FIG. 5 is a diagram illustrating an example of arithmetic operations in a case where redundancy of high-order bits is implemented in multiplication data of one's complement.

However, in the configuration in FIG. 5, components similar to those of the configuration in FIG. 4 are denoted by the same reference numerals and the description thereof will be omitted as appropriate. Note that, in the configuration in FIG. 5, added parts with respect to the configuration in FIG. 4 are represented by bold lines.

That is, in the configuration in FIG. 5, in addition to the multiplier 111, the multiplier 112, the multiplier 113, the adder 114, the multiplier 115, and the adder 116, a multiplier 131, an adder 132, a multiplier 133, an adder 134, and a majority voter (VOTER) 100A are additionally provided as compared with the configuration in FIG. 4. Note that the majority voter 100A has the configuration illustrated in FIG. 2.

Furthermore, in the configuration in FIG. 5, in addition to the logical operator 121, a logical operator 141, a logical operator 142, and a majority voter (VOTER) 100B are additionally provided as compared with the configuration in FIG. 4. Note that the majority voter 100E has the configuration illustrated in FIG. 2.

Moreover, in the configuration in FIG. 5, similarly to the configuration in FIG. 4, X data and Y data are used in arithmetic operations of the neural network and, among these pieces of data, for example, X can be assigned as input data and Y can be assigned as a weighting coefficient.

Here, in FIG. 5, since high-order bits of X[14:0], which is 15-bit data, are made redundant, X[14:9] as high-order bits is input three times. Likewise, since high-order bits of Y[14:0], which is 15-bit data, are made redundant, Y[14:9] as high-order bits is input three times. In addition, X[15] and Y[15] each representing the most significant bit are also made redundant and X[15] and Y[15] are input three times each.

In FIG. 5, as described above, arithmetic operations are performed on X[14:0] (high-order bits: X[14:9], low-order bits: X[8:0]) and Y[14:0] (high-order bits: Y[14:9], low-order bits: Y[8:0]) by the multiplier 111 to the adder 116, whereby 31-bit data is obtained. This 31-bit data is input to the majority voter 100A.

Furthermore, by multiplying X[14:9] by Y[14:9], both of which are redundant high-order bits, in the multiplier 131, X[14:9]·Y[14:9] is obtained. Additionally, by combining 18 bits all with 0 (18' b0) to the low-order bits of the arithmetic operation result obtained by the multiplier 131, 30-bit data (a combination of X[14:9]·Y[14:9] and 18' b0) is obtained.

Then, in the adder 132, the 30-bit data obtained by the arithmetic operation of the multiplier 131, the 25-bit data obtained by the arithmetic operations of the multiplier 112 to the adder 114, and the 18-bit data obtained by the arithmetic operation of the multiplier 115 are added. The resultant 31-bit data is input to the majority voter 100A.

Similarly, by multiplying X[14:9] by Y[14:9], both of which are other instances of the redundant high-order bits, in the multiplier 133, X [14:9]·Y[14:9] is obtained. Additionally, by combining 18 bits all with 0 (18' b0) to the low-order bits of the arithmetic operation result obtained by the multiplier 133, 30-bit data (a combination of X[14:9]·Y[14:9] and 18' b0) is obtained.

Then, in the adder 134, the 30-bit data obtained by the arithmetic operation of the multiplier 133, the 25-bit data obtained by the arithmetic operations of the multiplier 112 to the adder 114, and the 18-bit data obtained by the arithmetic operation of the multiplier 115 are added. The resultant 31-bit data is input to the majority voter 100A.

The 31-bit data obtained by the arithmetic operation of the adder 116, the 31-bit data obtained by the arithmetic operation of the adder 132, and the 31-bit data obtained by the arithmetic operation of the adder 134 are input to the majority voter 100A. By performing a majority vote operation, the majority voter 100A selects data in which two or more of the three pieces of data that have been input match and outputs the resultant 31-bit data (Z[30:0]).

In FIG. 5, as described above, an arithmetic operation for the exclusive OR (EXOR) between X[15] and Y[15], both of which are the most significant bits, is performed by the logical operator 121, whereby 1-bit data is obtained. This 1-bit data is input to the majority voter 100B.

In addition, an arithmetic operation for the exclusive OR between X[15] and Y[15], both of which are the redundant most significant bits, is performed in the logical operator 141 and the resultant 1-bit data is input to the majority voter 100B. Similarly, an arithmetic operation for the exclusive OR between X[15] and Y[15], both of which are other instances of the redundant most significant bits, is performed in the logical operator 142 and the resultant 1-bit data is input to the majority voter 100B.

The 1-bit data obtained by the arithmetic operation of the logical operator 121, the 1-bit data obtained by the arithmetic operation of the logical operator 141, and the 1-bit data obtained by the arithmetic operation of the logical operator 142 are input to the majority voter 100B. By performing a majority vote operation, the majority voter 100B selects data in which two or more of the three pieces of data that have been input match and outputs the resultant 1-bit data Z[31] indicating the positive or negative sign.

As described above, for example, in a case where redundancy of the high-order bits of the input data (X) and the weighting coefficient (Y) is implemented, in arithmetic operations of the neural network, the product-sum operations are performed on the input data (X) and the weighting coefficient (Y) and the resultant data (Z) is output via the majority voter 100. In this case, since the high-order bits are made redundant, more reliable arithmetic operations can be performed.

Furthermore, in arithmetic operations of the neural network, since a lot of arithmetic units such as adders and multipliers are used, the cost of power consumption, circuit area, and the like grows very large if simple multiplexing is applied. In the example of the arithmetic operations illustrated in FIG. 5, however, since only the high-order bits among all the bits are made redundant, the circuit area can be reduced while the power consumption is lowered as compared with a case where all the bits are made redundant.

Here, according to the simulation by the inventors of the present technology, for example, under the condition that high-order five bits of the 16 bits were made redundant three times, the obtained result is that the circuit area can be cut down to about half the dimension as compared with a case where all the bits are made redundant three times. In addition, if this result is represented by a mathematical formula, the result can be represented by following formula (3).

$$(16+2\times 5)/(16\times 3)=0.54 \qquad (3)$$

Note that, in the example of the arithmetic operations illustrated in FIG. 5, the reason why the high-order bits are selected as specific bits to be made redundant is that, for example, it is highly probable that the high-order bits are important bits as compared with other bits such as low-order bits and there is a possibility that the high-order bits are bits indicating the signs of plus and minus.

That is, the bit to be made redundant has been described as a high-order bit here but is not restricted to the high-order bit. Another bit may be employed as long as the another bit is an important bit. In addition, as long as a more important bit is made more redundant than the other bits, the other bits except the important bit may be made redundant. The number of bits to be made redundant is also arbitrary. Furthermore, the order of the bit string may be rearranged such that a predetermined bit is made redundant. For example, the order of the bit string may be rearranged such that the low-order bit is made redundant.

(Example of Case where Majority Voters are Multiplexed)

Figure 6:
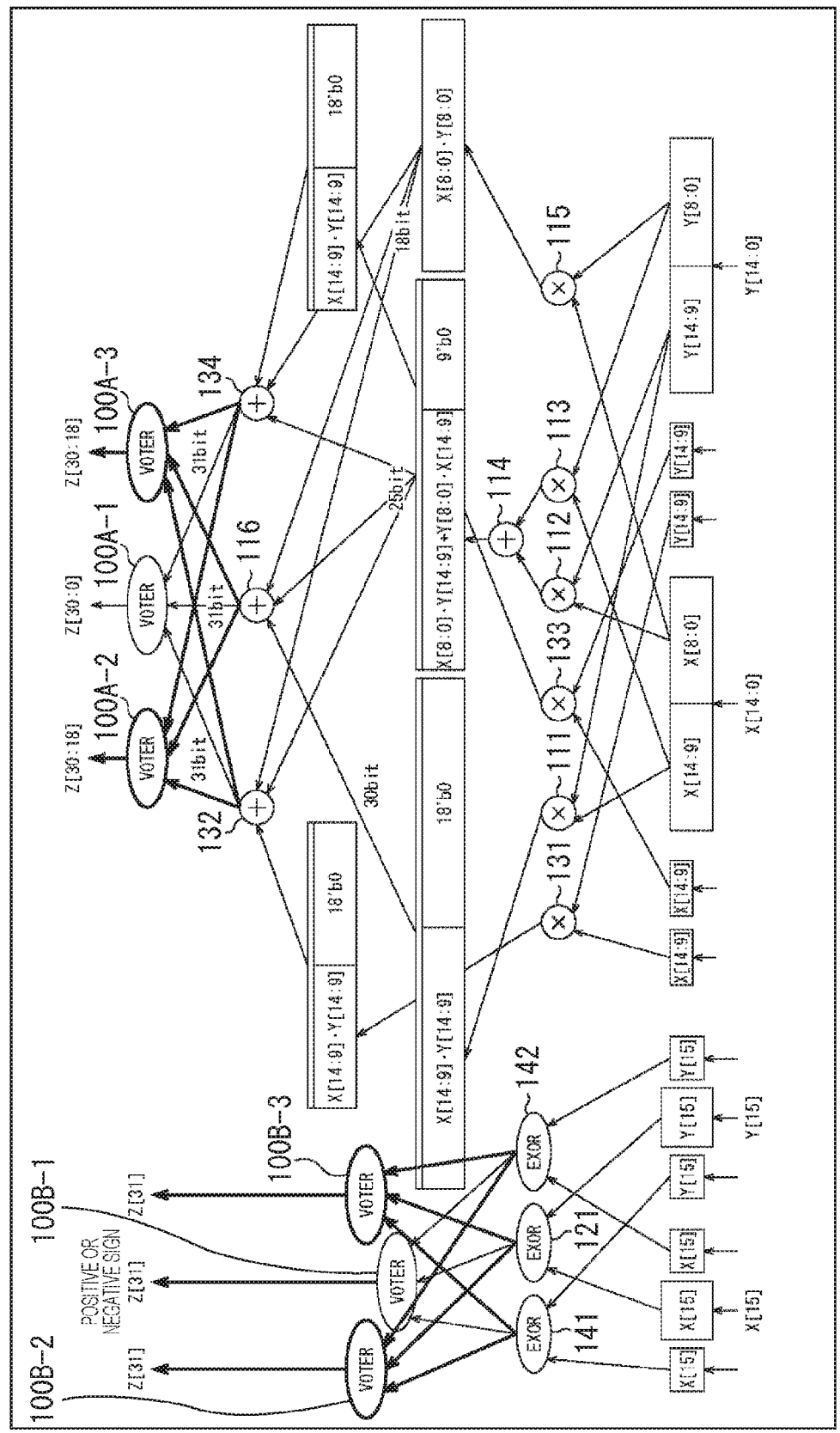
FIG. 6 is a diagram illustrating an example of a case where redundancy of high-order bits is implemented and redundancy of majority voters is additionally implemented in multiplication data of one's complement.

FIG. 6 is a diagram illustrating an example of a case where redundancy of high-order bits is implemented and multiplexing (redundancy) of majority voters is additionally implemented in multiplication data of one's complement.

However, in the configuration in FIG. 6, components similar to those of the configurations in FIGS. 4 and 5 are denoted by the same reference numerals and the description thereof will be omitted as appropriate. Note that, in the configuration in FIG. 6, added parts with respect to the configuration in FIG. 5 are represented by bold lines.

That is, in the configuration in FIG. 6, in addition to the multiplier 111, the multiplier 112, the multiplier 113, the adder 114, the multiplier 115, the multiplier 131, the adder 132, the multiplier 133, the adder 134, and the majority voter 100A (100A-1), a majority voter (VOTER) 100A-2 and a majority voter (VOTER) 100A-3 are additionally provided as compared with the configuration in FIG. 5. Note that the majority voters 100A-1 to 100A-3 have the configuration illustrated in FIG. 2. That is, in the configuration in FIG. 6, as illustrated in FIG. 3, the majority voters 100 are multiplexed.

Furthermore, in the configuration in FIG. 6, in addition to the logical operator 121, the logical operator 141, the logical operator 142, and the majority voter 100E (100B-1), a majority voter (VOTER) 100B-2 and a majority voter (VOTER) 100B-3 are additionally provided as compared with the configuration in FIG. 5. Note that the majority voters 100B-1 to 100B-3 have the configuration illustrated in FIG. 2.

Moreover, in the configuration in FIG. 6, similarly to the configurations in FIGS. 4 and 5, X data and Y data are used in arithmetic operations of the neural network and, among these pieces of data, for example, X can be assigned as input data and Y can be assigned as a weighting coefficient.

In FIG. 6, as described above, a majority vote operation is performed on the basis of the data input from the adder 116, the adder 132, and the adder 134 by the majority voter 100A-1 and the resultant 31-bit Z[30:0] is output.

In addition, the data obtained by the arithmetic operation of each of the adder 116, the adder 132, and the adder 134 is input to the majority voter 100A-2. By performing a majority vote operation, the majority voter 100A-2 selects data in which two or more of the three pieces of data that have been input match and outputs the resultant 13-bit Z[30:18].

Similarly, data obtained by the arithmetic operation of each of the adder 116, the adder 132, and the adder 134 is input to the majority voter 100A-3 such that a majority vote operation is performed according to the data that has been input and the resultant 13-bit Z[30:18] is output.

In FIG. 6, as described above, a majority vote operation is performed on the basis of 1-bit data input from the logical operator 121, the logical operator 141, and the logical operator 142 by the majority voter 100B-1 and the resultant 1-bit Z[31] indicating the positive or negative sign is output.

In addition, the 1-bit data obtained by the arithmetic operation of each of the logical operator 121, the logical operator 141, and the logical operator 142 is input to the majority voter 100B-2. By performing a majority vote operation, the majority voter 100B-2 selects data in which two or more of the three pieces of data that have been input match and outputs the resultant 1-bit data Z[31] indicating the positive or negative sign.

Similarly, 1-bit data obtained by the arithmetic operation of each of the logical operator 121, the logical operator 141, and the logical operator 142 is input to the majority voter 100B-3 such that a majority vote operation is performed according to the data that has been input and the resultant 1-bit Z [31] indicating the positive or negative sign is output.

As described above, for example, in a case where redundancy of the high-order bits of the input data (X) and the weighting coefficient (Y) is implemented and multiplexing (redundancy) of the majority voters 100 is additionally implemented, in arithmetic operations of the neural network, the product-sum operations are performed on the input data W and the weighting coefficient (Y) and the resultant data (Z) is output via the majority voters 100. In this case, since the high-order bits and the multiplicated units 100 are made redundant, more reliable arithmetic operations can be performed.

Furthermore, in arithmetic operations of the neural network, since a lot of arithmetic units such as adders and multipliers are used, the cost of power consumption, circuit area, and the like grows very large if simple multiplexing is applied. In the example of the arithmetic operations illustrated in FIG. 6, however, since only the high-order bits among all the bits are made redundant, the circuit area can be reduced while the power consumption is lowered as compared with a case where all the bits are made redundant.

(Example of Case where Redundancy of High-Order Bits is Implemented in Data of Cumulative Addition of Two's Complement)

Figure 7:
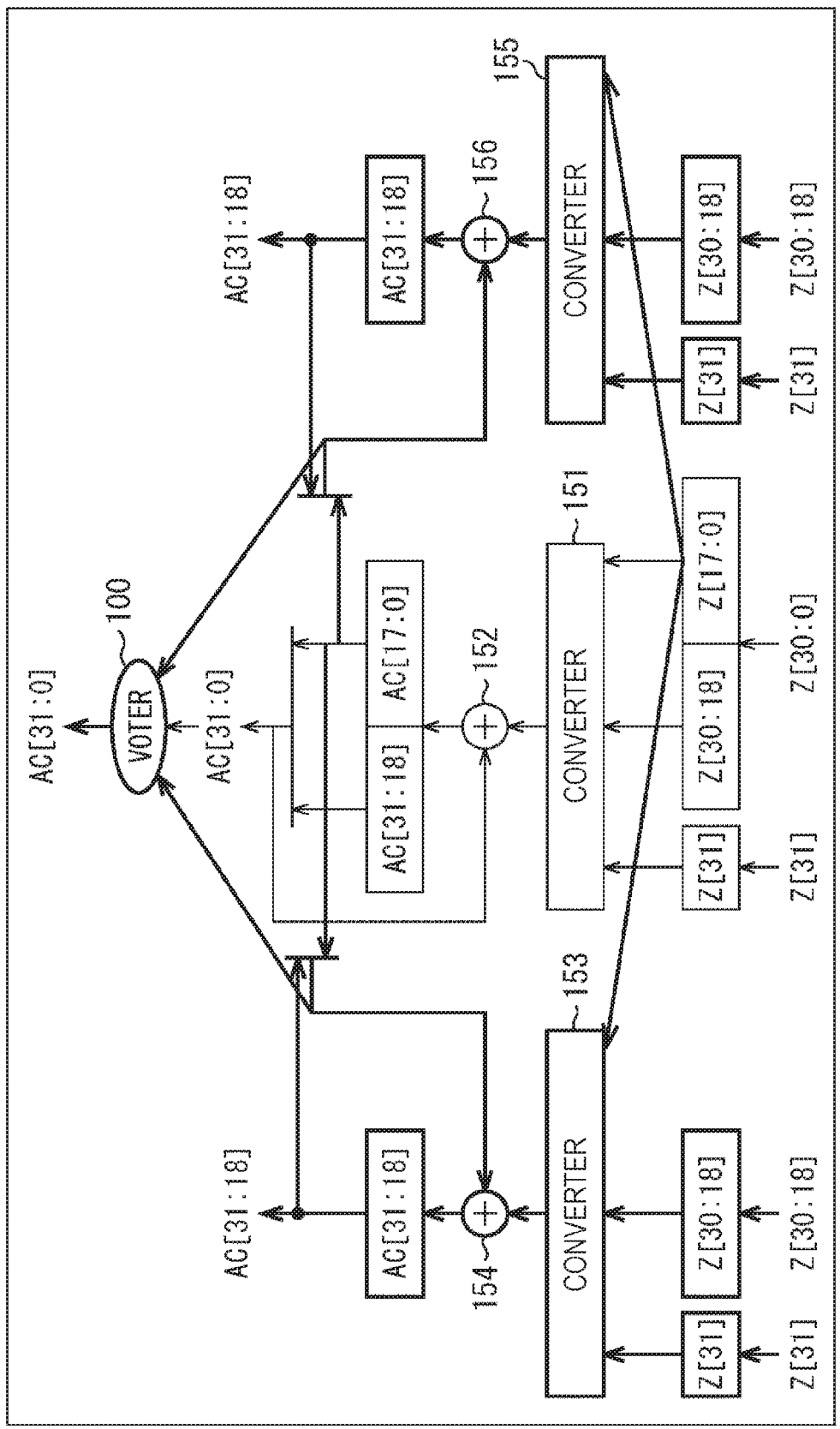
FIG. 7 is a diagram illustrating an example of arithmetic operations in a case where redundancy of high-order bits is implemented in data of cumulative addition of two's complement.

FIG. 7 is a diagram illustrating an example of arithmetic operations in a case where redundancy of high-order bits is implemented in data of cumulative addition of two's complement.

Here, in FIG. 7, since high-order bits of Z[30:0], which is 31-bit data, are made redundant, Z[30:18] is input three times separately. Likewise, Z[31], which is the most significant 1-bit data, is also made redundant and Z[31] is input three times separately.

In FIG. 7, Z [30:18] which is high-order bits of Z[30:0], Z[17:0] which is low-order bits thereof, and Z[31] as the most significant bit indicating the positive or negative sign are input to a converter 151 as data of one's complement. The converter 151 converts the data of one's complement that has been input into data of two's complement to output to an adder 152.

The adder 152 adds (cumulatively adds) the data of two's complement converted by the converter 151 and data of two's complement from the subsequent stage and outputs AC[31:0] (a combination of AC[31:18] and AC[17:0]) as the resultant data of cumulative addition of two's complement. The data of cumulative addition of two's complement. (AC[31:0]) obtained by this process is input to the majority voter 100.

In addition to redundant Z[30:18] and Z[31], Z[17:0], which is low-order bits of Z[30:0], is input to a converter 153 as data of one's complement. The converter 153 converts the data of one's complement that has been input into data of two's complement to output to an adder 154.

The adder 154 adds (cumulatively adds) the data of two's complement converged by the converter 153 and data from the subsequent stage (a combination of AC[31:18] and AC[17:0]) and outputs the resultant data of cumulative addition of two's complement (AC[31:18]). Then, the data of cumulative addition of two's complement (.AC[31:0] obtained by combining AC[31:18] and AC[17:0]) obtained from the data obtained by the arithmetic operation of the adder 154 (AC[31:18]) and the data obtained by the arithmetic operation of the adder 152 (AC[17:0]) is input to the majority voter 100.

In addition to other instances of redundant Z[30:18] and Z[31], Z[17:0], which is low-order bits of Z[30:0], is input to a converter 155 as data of one's complement. The converter 155 converts the data of one's complement that has been input into data of two's complement to output to an adder 156.

The adder 156 adds (cumulatively adds) the data of two's complement converted by the converter 155 and data from the subsequent stage (a combination of AC[31:18] and AC [1.7:0]) and outputs the resultant data of cumulative addition of two's complement (AC[31:18]). Then, the data of cumulative addition of two's complement (AC[31:0] obtained by combining AC[31:18] and AC[17:0]) obtained from the data obtained by the arithmetic operation of the adder 156 (AC[31:18]) and the data obtained by the arithmetic operation of the adder 152 (AC[17:0]) is input to the majority voter 100.

The 32-bit data obtained by the cumulative addition of the adder 152, the 32-bit data obtained by the cumulative addition of the adder 154, and the 32-bit data obtained by the cumulative addition of the adder 156 are input to the majority voter 100. By performing a majority vote operation, the majority voter 100 selects data in which two or more of the three pieces of data that have been input match and outputs the resultant 32-bit data (AC[31:0]).

As described above, in a case where redundancy of the high-order bits of the data (AC) of cumulative addition of two's complement is implemented, in arithmetic operations of the neural network, the cumulative addition of two's complement, is performed and the resultant data (AC) is output via the majority voter 100. In this case, since the high-order bits are made redundant, more reliable arithmetic operations can be performed.

Furthermore, in arithmetic operations of the neural network, since a lot of arithmetic units such as adders are used, the cost of power consumption, circuit area, and the like grows very large if simple multiplexing is applied. In the example of the arithmetic operations illustrated in FIG. 7, however, since only the high-order bits among all the bits are made redundant, the circuit area can be reduced while the power consumption is lowered as compared with a case where all the bits are made redundant.

Note that, in the example of the arithmetic operations illustrated in FIG. 7, the data of one's complement is processed after being converted into the data, of two's complement. Therefore, unlike the above-described case of performing arithmetic operations of the data of one's complement, it is not necessary to consider signs of plus and minus. In addition, in the above-described arithmetic operations of the neural network, the arithmetic operations on the data of one's complement and the data of two's complement have been described as examples, but other forms of data can also be processed in a similar manner.

<3. System Configuration>

(Configuration Example of Arithmetic Processing Device)

Figure 8:
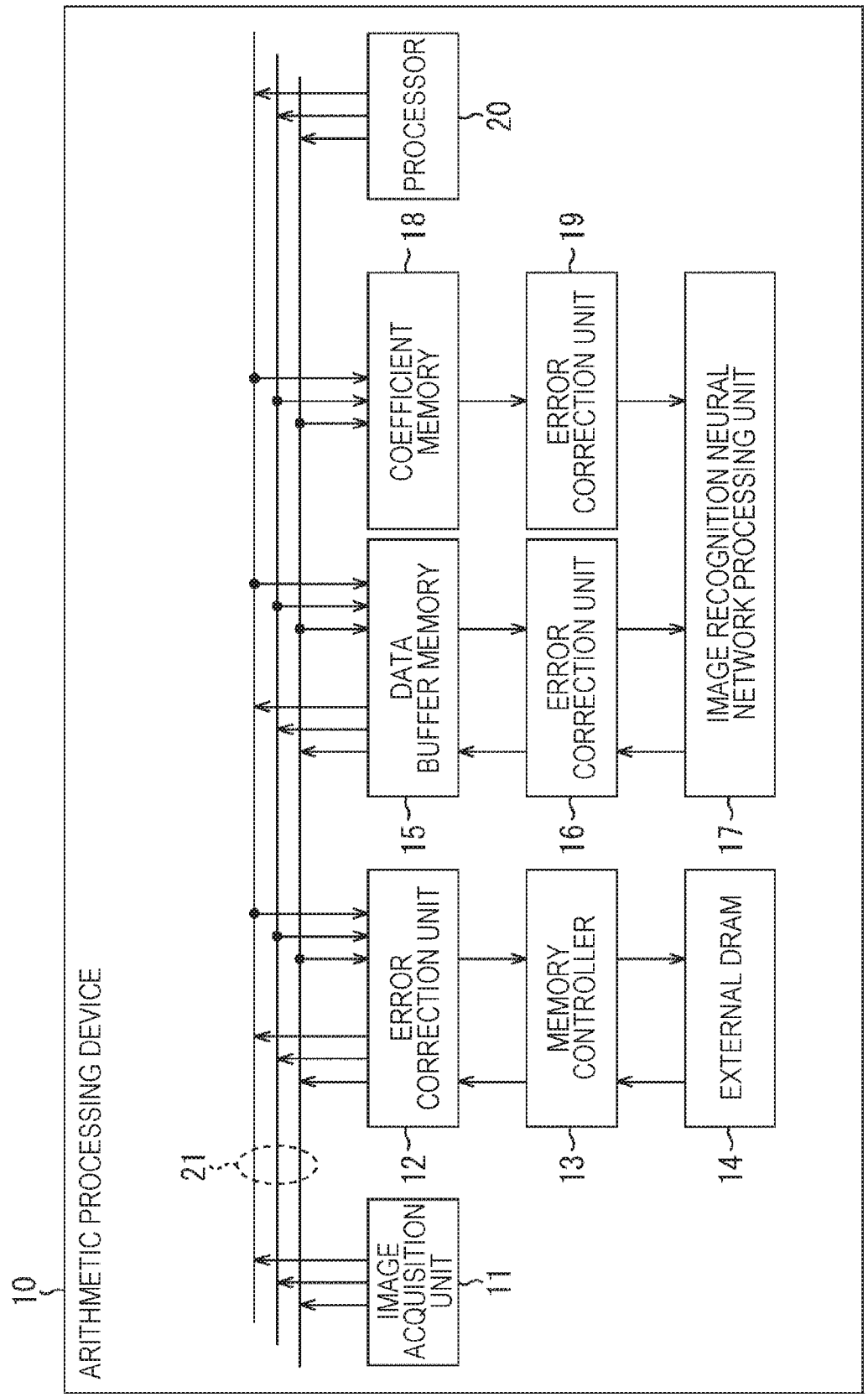
FIG. 8 is a diagram illustrating a configuration example of an arithmetic processing device to which the present technology is applied.

FIG. 8 is a diagram illustrating a configuration example of an arithmetic processing device to which the present technology is applied.

The arithmetic processing device 10 is a piece of equipment capable of performing arithmetic operations of the neural network on data that has been input. The arithmetic processing device 10 is, for example, an imaging device with an imaging function, an information processing device such as a personal computer or a server, and electronic equipment such as a field programmable gate array (FPGA).

In FIG. 8, the arithmetic processing device 10 is constituted by an image acquisition unit 11, an error correction unit 12, a memory controller 13, an external dynamic random access memory (DRAM) 14, a data buffer memory 15, an error correction unit 16, an image recognition neural network processing unit 17, a coefficient memory 18, an error correction unit 19, and a processor 20.

In addition, the image acquisition unit 11, the error correction unit 12, the data buffer memory 15, the coefficient memory 18, and the processor 20 are each connected to a triplexed triplex bus 21. Note that, in the arithmetic processing device 10, the error correction unit 12, the error correction unit 16, and the error correction unit 19 are each triplexed.

The image acquisition unit 11 acquires image data such as a captured image obtained by imaging a subject, for example, from an external device or the like. The image data acquired by the image acquisition unit 11 is supplied to the error correction unit 12 or the data buffer memory 15 via the triplex bus 21.

The error correction unit 12 is supplied with the image data acquired by the image acquisition unit 11 via the triplex bus 21. Note that, in this case, the target image data (the same data for all bits) is duplicated such that the resultant three pieces of image data will be supplied to the error correction unit 12 via the triplex bus 21.

The error correction unit 12 performs a majority vote operation on the three pieces of image data from the image acquisition unit 11 using the majority voter to select image data in which two or more pieces of image data match. Note that the majority voter used here is similar to the majority voter 100 in FIG. 2 described above. Then, the error correction unit 12 conducts a process of error correction coding on the image data (all the bits thereof) specified as a single piece of data by the majority vote operation. As the error correction code in this case, for example, Hamming code, Reed-Solomon code, or the like can be used.

The image data subjected to error correction coding by the error correction unit 12 is supplied to the memory controller 13. The memory controller 13 writes the image data from the error correction unit 12 to the external DRAM 14. With this process, the image data is stored in the external DRAM 14. On the other hand, in a case where the image data stored in the external DRAM 14 is read, the memory controller 13 reads the image data from the external DRAM 14 to supply to the error correction unit 12. However, all bits of data processed by the memory controller 13 are redundant.

The error correction unit 12 conducts a process of error correction decoding on the image data (the image data subjected to error correction coding) supplied from the memory controller 13. Then, the error correction unit 12 duplicates the image data subjected to error correction decoding (the same data for all bits) and outputs the three pieces of image data obtained by the duplication via the triplex bus 21.

The data buffer memory 15 is supplied with the image data acquired by the image acquisition unit 11 via the triplex bus 21. The data buffer memory 15 buffers the image data from the image acquisition unit 11 to supply to the error correction unit 16. However, it is assumed that the image data processed by the data buffer memory 15 has redundant (triplexed) high-order bits.

The error correction unit 16 conducts a process of error correction coding on the image data (the high-order bits thereof) from the data buffer memory 15. As the error correction code in this case, for example, Hamming code, Reed-Solomon code, or the like can be used. The image data subjected to error correction coding by the error correction unit 16 is supplied to the image recognition neural network processing unit 17.

The weighting coefficient is supplied to the coefficient memory 18, for example, from the processor 20, an external device, or the like via the triplex bus 21. With this process, the weighting coefficient is stored in the coefficient memory 18. However, it is assumed that the weighting coefficient (data thereof) stored in the coefficient memory 18 has redundant (triplexed) high-order bits. The weighting coefficient stored in the coefficient memory 18 is supplied to the error correction unit 19.

The error correction unit 19 conducts a process of error correction coding on the weighting coefficient (the high-order bits thereof) from the coefficient memory 18. As the error correction code in this case, for example, Hamming code, Reed-Solomon code, or the like can be used. The weighting coefficient subjected to error correction coding by the error correction unit 19 is supplied to the image recognition neural network processing unit 17.

The image recognition neural network processing unit 17 is supplied with the image data from the error correction unit 16 and the weighting coefficient from the error correction unit 19. The image recognition neural network processing unit 17 performs arithmetic operations of the neural network for image recognition using the image data as input data and the weighting coefficient.

As these arithmetic operations of the neural network, for example, the above-described arithmetic operations illustrated in FIGS. 5 to 7 are performed. That is, among the X data and the Y data in FIG. 5 and other drawings, X (input data) refers to the image data read from the data buffer memory 15 and Y (weighting coefficient) refers to the weighting coefficient read from the coefficient memory 18. Then, for example, data (Z and AC) obtained by performing product-sum operation and cumulative addition on the image data (X) and the weighting coefficient is supplied to the error correction unit 16.

Note that, since only the high-order bids of the image data (X) read from the data buffer memory 15 and the weighting coefficient (Y) read from the coefficient memory 18 are made redundant (triplexed), it is possible, as described earlier, to perform more reliable arithmetic operations while the power consumption is lowered and the circuit area is reduced, as compared with a case where all the bits are made redundant.

The error correction unit 16 conducts a process of error correction decoding on the data (the high-order bits thereof) (the data subjected to error correction coding) from the image recognition neural network processing unit 17. The error correction unit 16 supplies the data subjected to error correction decoding to the data buffer memory 15. Then, the data buffer memory 15 outputs result data of the arithmetic operations of the neural network supplied from the error correction unit 16, via the triplex bus 21.

Note that the data to be subjected to arithmetic operations of the neural network by the image recognition neural network processing unit 17 has been described here as being the image data acquired by the image acquisition unit 11 but, for example, other data such as image data read from the external DRAM 14 may be subjected to arithmetic operations of the neural network.

The processor 20 performs predetermined arithmetic process and control process. However, all bits of data processed by the processor 20 are redundant. For example, the processor 20 controls the action of each unit of the arithmetic processing device 10.

The arithmetic processing device 10 is configured as described above.

(Arithmetic Operation Example of Neural Network)

Next, a configuration example of a neural network for which arithmetic operations are performed by the image recognition neural network processing unit 17 (FIG. 8) will be described with reference to FIGS. 9 and 10.

(Configuration Example of Convolutional Neural Network)

Figure 9:
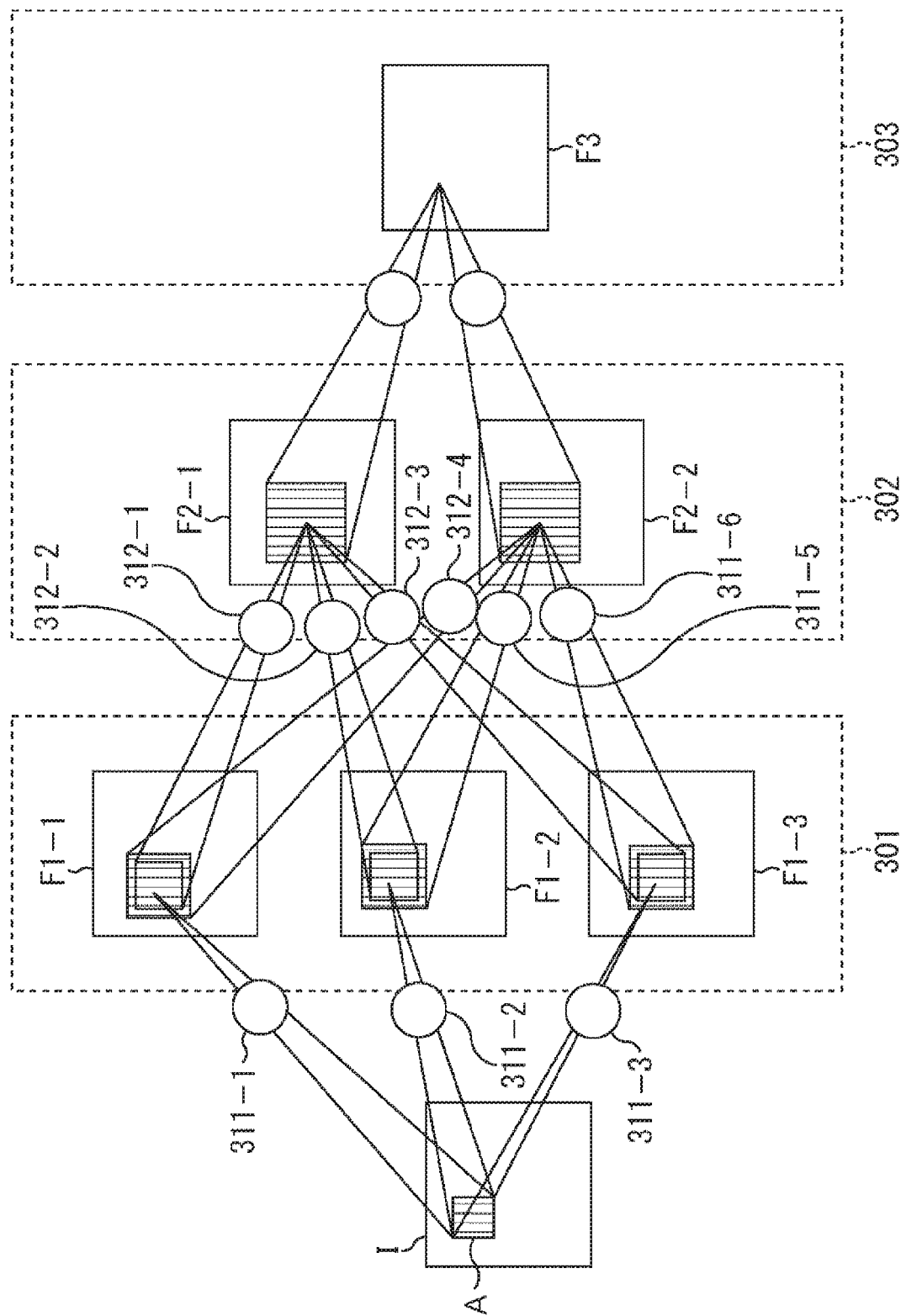
FIG. 9 is a diagram illustrating a conceptual configuration example of a convolutional neural network.

FIG. 9 is a diagram illustrating a conceptual configuration example of a convolutional neural network (CNN).

The convolutional neural network in FIG. 9 is constituted by three layers, namely, a first layer 301 where the number of features is three, a second layer 302 where the number of features is two, and a third layer 303 where the number of features is one.

Here, an image I is, for example, raster-scanned image data and refers to input data to the convolutional neural network. In addition, feature planes F1-1 to F1-3 indicate the feature planes of the first layer 301.

Note that the feature plane is an image data plane indicating a processing result obtained by performing arithmetic operations while scanning data of the previous layer with a predetermined feature extraction filter (for example, a convolution filter). Since this feature plane is a detection result for raster-scanned image data, the detection result is represented by a plane.

The feature planes F1-1 to F1-3 are generated by nonlinearly transforming the arithmetic operation results of two-dimensional convolution filters 311-1 to 311-3 for the image I. Note that an image region A in the image I indicates a reference image region necessary for convolution operations of the convolution filters 311-1 to 311-3.

The convolution filters 311-1 to 311-3 are convolution kernels with coefficients different from each other. In addition, the size of the convolution kernel is also different depending on the feature plans.

In the convolutional neural network, a plurality of filter kernels are scanned on a pixel-by-pixel basis, while the product-sum operation is repeated, and a final product-sum result is nonlinearly transformed, such that a feature plane is generated. For example, in the case of calculating the feature plane F1-1 in the first layer 301, since the number of combinations with the previous layer is one, the single convolution filter 311-1 is employed as the filter kernel.

Meanwhile, in the case of calculating the feature planes F2-1 and F2-2 in the second layer 302, since the number of combinations with the previous layer (the feature planes thereof) is three, accumulative addition is performed separately on the arithmetic operation results of the convolution filters 312-1 to 312-3 and the arithmetic operation results of the convolution filters 312-4 to 312-6. That is, for example, the feature plane F2-1 is obtained by accumulatively adding outputs of the convolution filters 312-1 to 312-3 and lastly performing nonlinear transformation.

Here, the convolution filters 312-1 to 312-6 are convolution kernels with individually different filter coefficients. In addition, the convolution filters 312-1 to 312-3 and the convolution filters 312-4 to 312-6 have different kernel sizes.

Furthermore, the basic configuration of each convolution filter 312 for accumulative addition and nonlinear transformation processes is similar to the configuration of a general neuron. Here, for example, the neuron is constituted by a multiplier configured to multiply input data (in_1 to in_n) by a weighting coefficient (w_1 to w_n), an accumulative adder configured to accumulatively add arithmetic operation results from a plurality of the multipliers, and a nonlinear transformation unit configured to nonlinearly transform the arithmetic operation result from the accumulative adder to output.

That is, the filter coefficients of the convolution kernels refer to the weighting coefficients w_1 to w_n. In a case where the feature plane is combined with a plurality of the previous layers (the feature planes thereof) as in the feature planes F2-1 and F2-2 in the second layer 302 and the feature plane F3 in the third layer 303, the arithmetic operation results of a plurality of convolution kernels are collected by the accumulative adder. That is, the number of combinations refers to the convolution kernel size x the number of feature planes in the previous layer.

As described thus far, in the convolutional neural network, the results are held on an image plane basis and combined in a hierarchical manner for each feature extraction, whereby superior performance is demonstrated in many tasks in the field of image recognition.

In addition, in the convolutional neural network, if the input data and the filter coefficient (weighting coefficient) are made redundant (for example, triplexed), further reliability of the data can be achieved. However, a large number of arithmetic units are used in the convolution filters, the cost of power consumption, circuit area, and the like grows very large. Meanwhile, if the present technology is applied to the convolutional neural network such that only a more important specific bit (for example, the high-order bit) among all the bits is made redundant, it is possible to reduce the circuit area while lowering the power consumption, as compared with a case where all the bits are made redundant.

(Configuration Example of Convolutional Neural Network)

Figure 10:
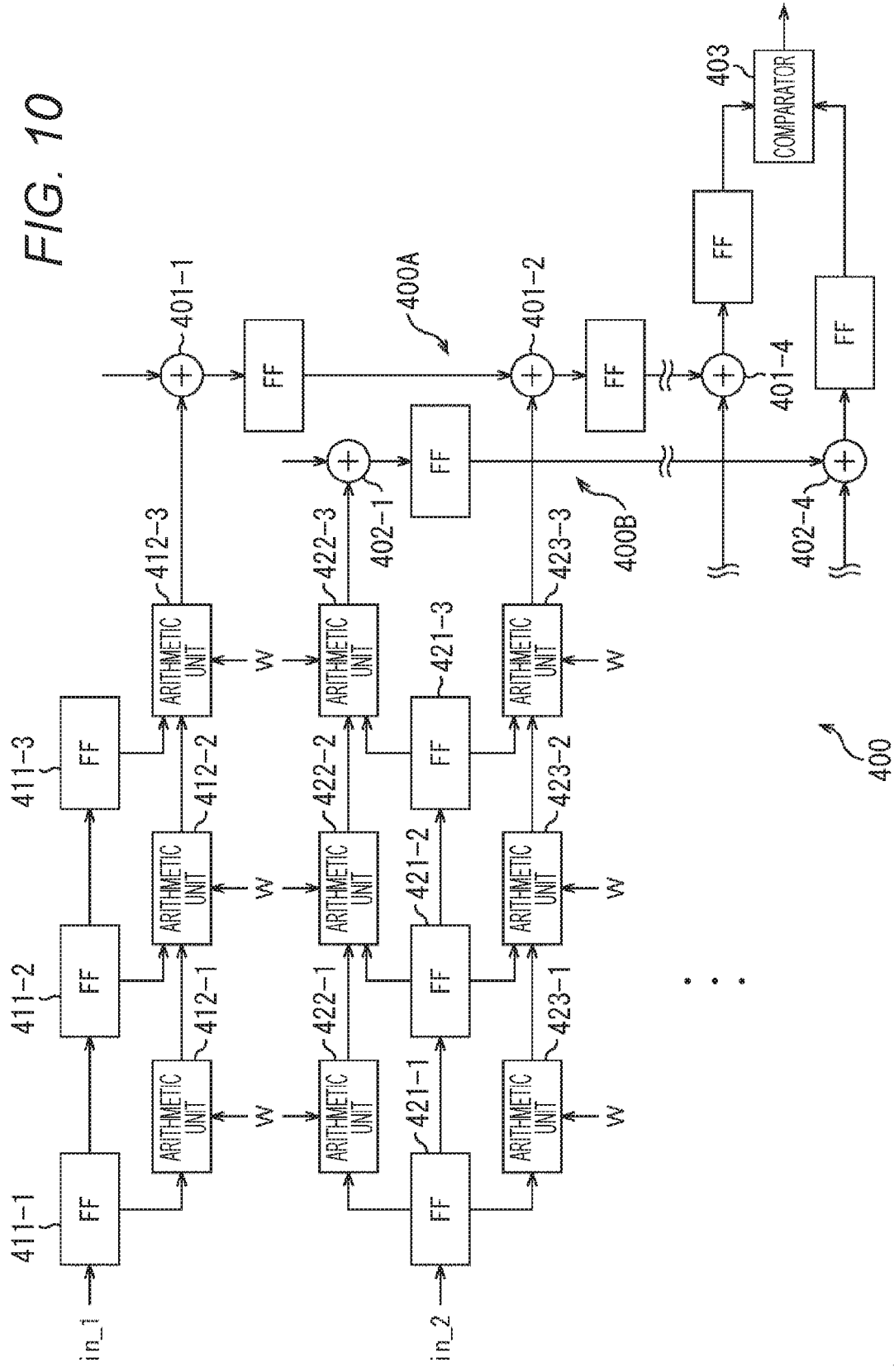
FIG. 10 is a diagram illustrating a configuration example of a convolutional arithmetic operation unit.

FIG. 10 is a diagram illustrating a configuration example of a convolutional arithmetic operation unit configured to perform arithmetic operations of the convolutional neural network (CNN).

The convolutional arithmetic operation unit 400 in FIG. 10 includes a systolic array 400A and a systolic array 400B. In FIG. 10, the systolic array 400A and the systolic array 400B are configured by mutually connecting a plurality of arithmetic units having the same configuration. The respective arithmetic units are arranged in three stages from an input side to which data from the previous layer is input, toward an output side from which convolutional arithmetic operation result data is output.

The systolic array 400A has four arithmetic lines each made up of arithmetic units in three stages. The example in FIG. 10 illustrates two arithmetic lines out of the four arithmetic lines, that is, an arithmetic line made up of arithmetic units 412-1 to 412-3 and an arithmetic line made up of arithmetic units 423-1 to 423-3.

Flip-flop circuits 411-1 to 411-3 are provided in the arithmetic line made up of the arithmetic units 412-1 to 412-3. In addition, weighting coefficients (W) are input to the respective arithmetic units 412-1 to 412-3. Likewise, flip-flop circuits 421-1 to 421-3 are provided in the arithmetic line made up of the arithmetic units 423-1 to 423-3. In addition, weighting coefficients (W) are input to the respective arithmetic units 423-1 to 423-3. Note that, although not illustrated, the remaining two arithmetic lines are configured similarly to the arithmetic lines illustrated in FIG. 10.

In this manner, the systolic array 400A sequentially transfers the arithmetic operation result of the arithmetic unit in each stage to the arithmetic unit on the output side at every arithmetic cycle in each of the four arithmetic lines, thereby performing the convolutional arithmetic operations in parallel. Then, in the systolic array 400A, the data of the arithmetic operation result obtained from each arithmetic line is added by adders 401-1 to 401-4 and output as the data of the convolutional arithmetic operation result.

The systolic array 400B has four arithmetic lines each made up of arithmetic units in three stages. The example in FIG. 10 illustrates one arithmetic line out of the four arithmetic lines, that is, an arithmetic line made up of arithmetic units 422-1 to 422-3.

Flip-flop circuits 421-1 to 421-3 are provided in the arithmetic line made up of the arithmetic units 422-1 to 422-3. In addition, weighting coefficients (W) are input to the respective arithmetic units 422-1 to 422-3. Note that, although not illustrated, the remaining three arithmetic lines are configured similarly to the arithmetic lines illustrated in FIG. 10.

In this manner, the systolic array 400B sequentially transfers the arithmetic operation result of the arithmetic unit in each stage to the arithmetic unit on the output side at every arithmetic cycle in each of the four arithmetic lines, thereby performing the convolutional arithmetic operations in parallel. Then, in the systolic array 400B, the data of the arithmetic operation result obtained from each arithmetic line is added by adders 402-1 to 402-4 and output as the data of the convolutional arithmetic operation result.

The data of the convolutional arithmetic operation result from the systolic array 400A and the data of the convolutional arithmetic operation result from the systolic array 400B are input to a comparator 403. The comparator 403 compares the two pieces of input data and outputs data having a larger value as the maximum convolutional arithmetic operation result data.

The configuration example of the convolutional arithmetic operation unit has been indicated above. In this convolutional arithmetic operation unit, since the arithmetic units constituting each arithmetic line of the systolic array are constituted by arithmetic units such as adders and multipliers and a large number of arithmetic units are used, the cost of power consumption, circuit area, and the like grows very large if all the bits of the input data and the weighting coefficient (W) are made redundant. Meanwhile, if the present technology is applied also to this type of convolutional arithmetic operation unit such that only a more important specific bit (for example, the high-order bit) among all the bits is made redundant, it is possible to reduce the circuit area while lowering the power consumption, as compared with a case where all the bits are made redundant.

<4. Variations>

(Form of Decimal Point)

In the above explanation, a case where the data form of the input data and the weighting coefficient takes the form of fixed-point has been described as the arithmetic operations of the neural network by the image recognition neural network processing unit 17 (FIG. 8). However, the data form of the input data and the weighting coefficient is not restricted to the form of fixed-point but may be the form of floating-point.

Figure 11:
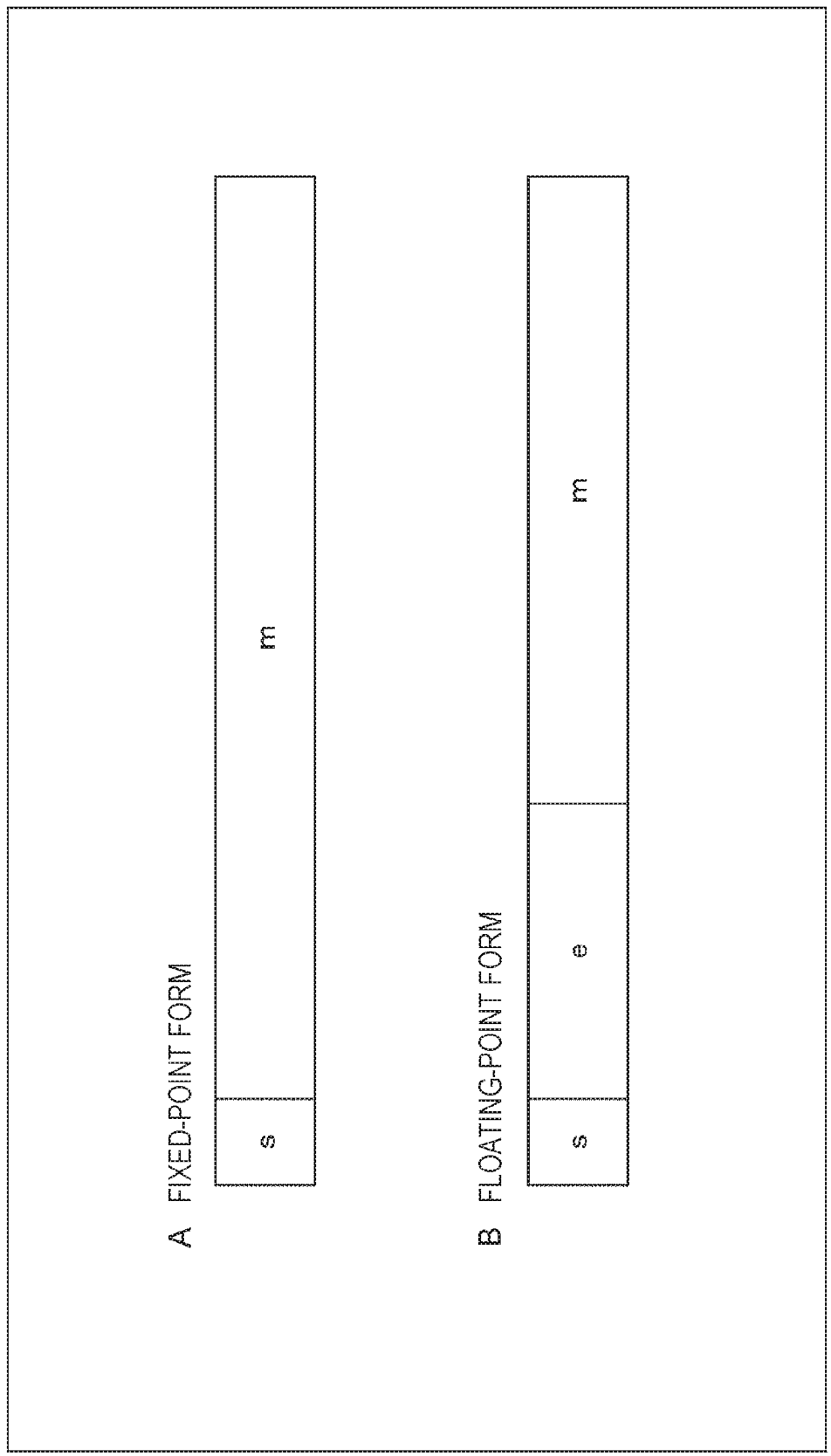
FIG. 11 is a diagram for explaining a fixed-point form and a floating-point form.

The fixed-point form and the floating-point form will be described here with reference to FIG. 11. A of FIG. 11 illustrates an example of the format of the fixed-point form. In A of FIG. 11, "s" is a sign portion representing the sign of plus or minus with one bit. For example, in a case where the value of "s" is "0", it represents that the sign is positive and, in a case where the value is "1", it represents that the sign is negative. "m" is a numerical value portion and, in a case where the decimal point is fixed, for example, to the least significant bit, it serves as an integer portion.

That is, in the fixed-point form, since the position of the decimal point is designated, the range of values that can be expressed is narrower than that in the floating-point form, but there are advantages such as high-speed arithmetic operation.

Meanwhile, B of FIG. 11 illustrates an example of the format of the floating-point form. In B of FIG. 11, "s" is a sign portion and represents the sign of plus or minus with one bit. "e" is an exponent portion and represents the power portion of the floating-point. "m" is a mantissa portion and serves as portion containing a valid character when the exponent portion is written. For example, in the case of A×10B, A is the mantissa portion.

That is, in the floating-point form, by defining the mantissa portion and the exponent portion, it is possible to express numerical values in a wider range than in the fixed-point form. Note that, for example, floating-point numbers defined by IEEE 754 (IEEE standard for floating-point arithmetic) can be adopted as the floating-point form.

In the present technology, even if the data form of the input data and the weighting coefficient is in the form of floating-point, a more important bit (for example, the high-order bit) is made redundant (for example, triplexed) as in the case of the form of fixed-point, it is possible to reduce the circuit area while lowering the power consumption as compared with a case where all the bits are made redundant.

(Another Example of Majority Vote Operation)

In the above explanation, three pieces of data (the input data and the weighting coefficient) input by way of different arithmetic units have been described as data to be subjected to majority vote operation by the majority voter 100, but other data can be used as data to be subjected to majority vote operation. For example, though it takes time for arithmetic operations, it is possible to repeat the same arithmetic operation three times and perform the majority vote operation using the resultant three pieces of data.

However, when the arithmetic operation is repeated as described above, it is desirable to perform arithmetic operations through different arithmetic units or routes by changing the way of putting data. In addition, in repeating arithmetic operations, it is possible to suppress the consumption of extra resource by assigning an important bit such as the high-order bit as a bit to be saved for the majority vote operation to be performed afterwards.

(Use for Finding Failure)

The above explanation has described that a failure occurring in a single circuit can be masked by making the circuit redundant and performing the majority vote operation by the majority voter 100. However, a failure may be found by the majority vote operation. That is, in this case, the configuration of the present technology is used as a failure detection function for switching to a standby circuit.

For example, while the high-order bits are triplexed and the low-order bits are also duplexed, when a hardware error is found by the majority vote operation by the majority voter 100, switching to a standby arithmetic unit prepared in advance is carried out. As a result, the normal action can be continued by the standby arithmetic unit.

In addition, for example, in a case where the above-described configuration of the present technology is applied to a field programmable gate array (FPGA), when a hardware error is found by the majority vote operation by the majority voter 100, the FPGA can continue the normal action by reconfiguring such that a logic cell with no failure is to be used.

(Application to Radiation Working Environment)

In a radiation working environment, in a case where an autonomous automatic driving device has a function of, for example, autonomously determining the action on the basis of information obtained by an image recognition process using the arithmetic operations of the neural network, the above-described configuration of the present technology can also be applied to an arithmetic operation unit configured to perform such arithmetic operations of the neural network. Even under such special circumstances, it is possible to perform more reliable arithmetic operations of the neural network while lowering the power consumption and also reducing the circuit area.

(Improvement of Yield of Arithmetic LSI)

As described above, it is possible to mask a failure occurring in a single circuit by multiplexing circuits (making circuits redundant) and performing the majority vote operation by the majority voter 100. If this fact is grasped from the viewpoint of yield, for example, since it is possible to mask a failure occurring in a single circuit in large scale integration (LSI) for arithmetic operations of the neural network to which the above-described configuration of the present technology is applied, it can also be said that the yield is improved. In other words, the configuration of the present technology can be used as a measure for improving yield if the hardware error is a single failure.

(Other Variations)

The above explanation has described that the image recognition neural network processing unit 17 in the arithmetic processing device 10 (FIG. 8) performs arithmetic operations of the neural network using the image data acquired by the image acquisition unit 11. However, image data of any form such as image data output from an image sensor or image data in a predetermined file format, for example, can be assigned as target image data used in the arithmetic operations of the neural network. In addition, besides the image data, data of any form such as audio data and text data, for example, can be assigned as target data.

Furthermore, in the above explanation, basically, examples of triplexing have been described as an example of multiplexing (redundancy). However, as long as multiplexing (redundancy) is possible, multiplexing (redundancy) is not restricted to triplexing but other modes of multiplexing (redundancy) can be adopted, for example, by raising the multiplicity.

<5. Configuration of Computer>

A series of the above-described processes can be executed by hardware as well and also can be executed by software. In a case where the series of the processes is executed by software, a program constituting the software is installed in a computer. Herein, the computer includes a computer built into dedicated hardware, a computer capable of executing various functions when installed with various programs, for example, a general-purpose personal computer, and the like.

Figure 12:
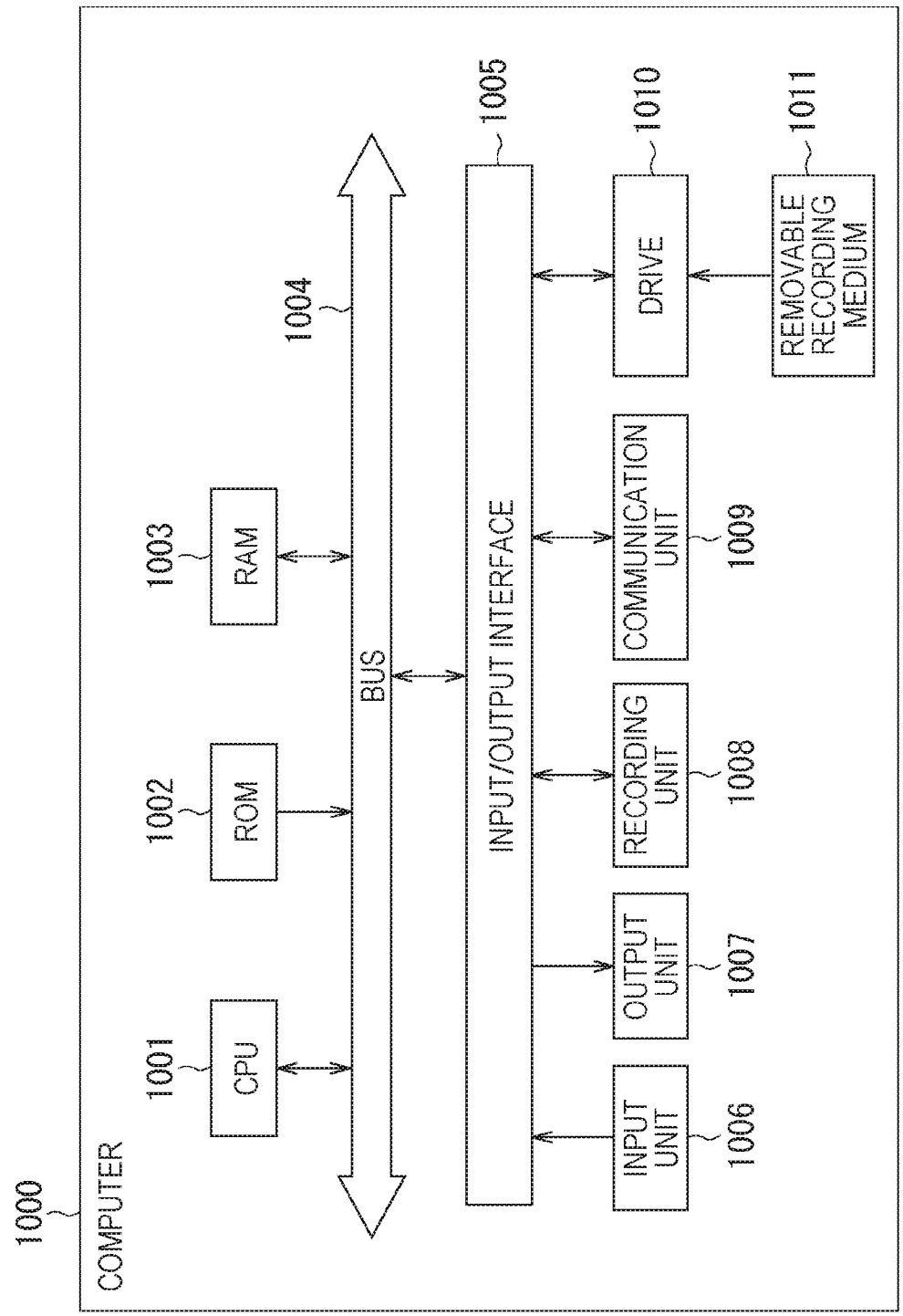
FIG. 12 is a diagram illustrating a configuration example of a computer.

FIG. 12 is a block diagram illustrating a hardware configuration example of a computer that executes the aforementioned series of the processes using a program.

In the computer 1000, a central processing unit (CPU) 1001, a read only memory (ROM) 1002, and a random access memory (RAM) 1003 are interconnected through a bus 1004. Additionally, an input/output interface 1005 is connected to the bus 1004. An input unit 1006, an output unit 1007, a recording unit 1008, a communication unit 1009, and a drive 1010 are connected to the input/output interface 1005.

The input unit 1006 includes a keyboard, a mouse, a microphone and the like. The output unit 1007 includes a display, a speaker and the like. The recording unit 1008 includes a hard disk, a non-volatile memory and the like. The communication unit 1009 includes a network interface and the like. The drive 1010 drives a removable recording medium 1011 such as a magnetic disk, an optical disc, a magneto-optical disk, or a semiconductor memory.

In the computer 1000 configured as described above, for example, the aforementioned series of the processes is performed in such a manner that the CPU 1001 loads a program stored in the recording unit 1008 to the RAM 1003 via the input/output interface 1005 and the bus 1004 to execute.

For example, the program executed by the computer 1000 (CPU 1001) can be provided by being recorded in the removable recording medium 1011 serving as a package medium or the like. Furthermore, the program can be provided via a wired or wireless transmission medium such as a local area network, the Internet, or digital satellite broadcasting.

In the computer 1000, the program can be installed to the recording unit 1008 via the input/output interface 1005 by mounting the removable recording medium 1011 in the drive 1010. In addition, the program can also be installed to the recording unit 1008 via a wired or wireless transmission medium when received by the communication unit 1009. As an alternative manner, the program can be installed to the ROM 1002 or the recording unit 1008 in advance.

Note that the program executed by the computer 1000 may be a program in which the processes are performed along the time series in accordance with the order described in the present description, or alternatively, may be a program in which the processes are performed in parallel or at a necessary timing, for example, when called.

In addition, as for the program, a single computer may be employed for the process thereof, or alternatively, a plurality of computers may be employed for the distributed processes thereof. Furthermore, the program may be transferred to a remote computer and executed.

Additionally, in the present description, a system stands for a collection of a plurality of constituent members (e.g., devices and modules (parts)) and whether or not all the constituent members are located within the same cabinet is not regarded as important. Accordingly, a plurality of devices accommodated in separate cabinets so as to be connected to one another via a network and one device of which a plurality of modules is accommodated within one cabinet are both deemed as systems.

Note that the embodiments according to the present technology are not limited to the aforementioned embodiments and a variety of modifications can be made without departing from the scope of the present technology. For example, the present technology can employ a cloud computing configuration in which one function is divided and allocated to a plurality of devices so as to be processed in coordination there among via a network.

In addition, the present technology can also be configured as described below.

(1)

An arithmetic processing device including an arithmetic processing unit that performs an arithmetic operation of a neural network, in which in the arithmetic operation of the neural network, a specific part of bits of a weighting coefficient and input data used for the arithmetic operation is made redundant such that redundancy of the specific part of bits becomes larger than redundancy of remaining bits except the specific part of bits.

(2)

The arithmetic processing device according to (1), in which in the arithmetic operation of the neural network, only the specific part of bits among bits of the weighting coefficient and the input data is made redundant.

(3)

The arithmetic processing device according to (2), in which in the arithmetic operation of the neural network, only a high-order bit among bits of the weighting coefficient and the input data is made redundant.

(4)

The arithmetic processing device according to any one of (1) to (3), in which a data form of the weighting coefficient and the input data is in a form of fixed-point.

(5)

The arithmetic processing device according to any one of (1) to (3), in which a data form of the weighting coefficient and the input data is in a form of floating-point.

(6)

The arithmetic processing device according to any one of (1) to (5), further including an error correction unit that performs coding or decoding for an error correction code on a specific part of bits of the weighting coefficient and the input data.

(7)

The arithmetic processing device according to (6), further including:

a first memory unit that stores data to be processed by the arithmetic processing unit; and a second memory unit that stores the weighting coefficient, in which the error correction unit includes:

a first error correction unit provided between the arithmetic processing unit and the first memory unit; and a second error correction unit provided between the arithmetic processing unit and the second memory unit.

(8)

The arithmetic processing device according to (6) or (7), in which the error correction unit is multiplexed.

(9)

The arithmetic processing device according to any one of (1) to (8), in which the arithmetic processing unit includes:

an arithmetic unit that performs a product-sum operation of the weighting coefficient and the input data; and a majority voter that performs a majority vote operation on data obtained from the arithmetic unit and outputs data obtained as a result of the majority vote operation.

(10)

The arithmetic processing device according to (9), in which the arithmetic unit and the majority voter are multiplexed.

(11)

An arithmetic processing method for an arithmetic processing device including an arithmetic processing unit that performs an arithmetic operation of a neural network, the arithmetic processing method including a step of processing data by the arithmetic processing unit in the arithmetic operation of the neural network, the data being data in which a specific part of bits of a weighting coefficient and input data used for the arithmetic operation is made redundant such that redundancy of the specific part of bits becomes larger than redundancy of remaining bits except the specific part of bits.

REFERENCE SIGNS LIST

10 Arithmetic processing device
11 Image acquisition unit
12 Error correction unit
13 Memory controller
14 External DRAM
Data buffer memory
16 Error correction unit
17 Image recognition neural network processing unit
18 Coefficient memory
19 Error correction unit
20 Processor
21 Triplex bus
100, 100A, 100A-1 to 100A-3, 100B, 100B-1 to 100B-3 Majority voter
111 Multiplier
112 Multiplier
113 Multiplier
114 Adder
115 Multiplier
116 Adder
121 Logical operator
131 Multiplier
132 Adder
133 Multiplier
134 Adder
141 Logical operator
142 Logical operator
151 Converter
152 Adder
153 Converter
154 Adder
155 Converter
156 Adder
1000 Computer
1001 CPU

The invention claimed is:

1. An arithmetic processing device comprising an arithmetic processing unit that performs an arithmetic operation of a neural network, wherein in the arithmetic operation of the neural network, a specific part of bits of a weighting coefficient and input data used for the arithmetic operation is made redundant such that redundancy of the specific part of bits becomes larger than redundancy of remaining bits except the specific part of bits.

2. The arithmetic processing device according to claim 1, wherein in the arithmetic operation of the neural network, only the specific part of bits among bits of the weighting coefficient and the input data is made redundant.

3. The arithmetic processing device according to claim 2, wherein in the arithmetic operation of the neural network, only a high-order bit among bits of the weighting coefficient and the input data is made redundant.

4. The arithmetic processing device according to claim 3, wherein a data form of the weighting coefficient and the input data is in a form of fixed-point.

5. The arithmetic processing device according to claim 3, wherein a data form of the weighting coefficient and the input data is in a form of floating-point.

6. The arithmetic processing device according to claim 1, further comprising an error correction unit that performs coding or decoding for an error correction code on the specific part of bits of the weighting coefficient and the input data.

7. The arithmetic processing device according to claim 6, further comprising:
   a first memory unit that stores data to be processed by the arithmetic processing unit; and
   a second memory unit that stores the weighting coefficient, wherein
   the error correction unit includes:
      a first error correction unit provided between the arithmetic processing unit and the first memory unit; and
      a second error correction unit provided between the arithmetic processing unit and the second memory unit.

8. The arithmetic processing device according to claim 6, wherein the error correction unit outputs a multiplexed output.

9. The arithmetic processing device according to claim 1, wherein
   the arithmetic processing unit includes:
      an arithmetic unit that performs a product-sum operation of the weighting coefficient and the input data; and
      a majority voter that performs a majority vote operation on data obtained from the arithmetic unit and outputs data obtained as a result of the majority vote operation.

10. The arithmetic processing device according to claim 9, wherein
    the arithmetic unit and the majority voter each output a multiplexed output.

11. An arithmetic processing method for an arithmetic processing device including an arithmetic processing unit that performs an arithmetic operation of a neural network,
    the arithmetic processing method comprising a step of processing data by the arithmetic processing unit in the arithmetic operation of the neural network, the data being data in which a specific part of bits of a weighting coefficient and input data used for the arithmetic operation is made redundant such that redundancy of the specific part of bits becomes larger than redundancy of remaining bits except the specific part of bits.

12. An arithmetic processing device comprising:
    an arithmetic processing unit that performs an arithmetic operation of a neural network, wherein
    in the arithmetic operation of the neural network, a first specific part of bits of a weighting coefficient used for the arithmetic operation and a second specific part of bits of input data used for the arithmetic operation are made redundant such that redundancy of the first specific part of bits and the second specific part of bits becomes larger than redundancy of first remaining bits of the weighting coefficient and second remaining bits of the input data.

13. The arithmetic processing device according to claim 12, wherein
    in the arithmetic operation of the neural network, only the first specific part of bits and the second specific part of bits are made redundant.

14. The arithmetic processing device according to claim 13, wherein
    in the arithmetic operation of the neural network, only a high-order bit among bits of the weighting coefficient and bits of the input data is made redundant.

15. The arithmetic processing device according to claim 14, wherein
    a data form of the weighting coefficient and the input data is in a form of fixed-point.

16. The arithmetic processing device according to claim 14, wherein
    a data form of the weighting coefficient and the input data is in a form of floating-point.

17. The arithmetic processing device according to claim 12, further comprising an error correction unit that performs coding or decoding for an error correction code on a third specific part of bits of the weighting coefficient and a fourth specific part of bits of the input data.

18. The arithmetic processing device according to claim 17, further comprising:
    a first memory unit that stores data to be processed by the arithmetic processing unit; and
    a second memory unit that stores the weighting coefficient, wherein
    the error correction unit includes:
       a first error correction unit provided between the arithmetic processing unit and the first memory unit; and
       a second error correction unit provided between the arithmetic processing unit and the second memory unit.

19. The arithmetic processing device according to claim 17, wherein
    the error correction unit outputs a multiplexed output.

20. The arithmetic processing device according to claim 12, wherein
    the arithmetic processing unit includes:
       an arithmetic unit that performs a product-sum operation of the weighting coefficient and the input data; and
       a majority voter that performs a majority vote operation on data obtained from the arithmetic unit and outputs data obtained as a result of the majority vote operation.

* * * * *